(12) United States Patent
Matsumoto

(10) Patent No.: US 8,537,334 B2
(45) Date of Patent: Sep. 17, 2013

(54) MEASURING APPARATUS AND PROJECTION EXPOSURE APPARATUS HAVING THE SAME

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1145 days.

(21) Appl. No.: 11/939,168

(22) Filed: Nov. 13, 2007

(65) Prior Publication Data

US 2008/0137052 A1   Jun. 12, 2008

(30) Foreign Application Priority Data

Dec. 6, 2006  (JP) ................................ 2006-329915

(51) Int. Cl.
*G03B 27/52* (2006.01)
*G03B 27/68* (2006.01)
*G03B 27/54* (2006.01)

(52) U.S. Cl.
USPC ................... 355/55; 355/52; 355/61; 355/62; 355/67

(58) Field of Classification Search
USPC ................. 355/52, 53, 55, 59, 61, 62, 67, 72, 355/77; 356/4.01, 4.03, 4.04; 430/5, 22, 430/30, 311, 312; 250/492.1, 492.2, 492.22, 250/548
See application file for complete search history.

(56) References Cited

U.S. PATENT DOCUMENTS

| | | | |
|---|---|---|---|
| 4,908,656 A | 3/1990 | Suwa et al. | |
| 5,408,083 A * | 4/1995 | Hirukawa et al. | 250/201.2 |
| 5,440,394 A * | 8/1995 | Nose et al. | 356/636 |
| 5,654,553 A * | 8/1997 | Kawakubo et al. | 250/548 |
| 5,754,299 A * | 5/1998 | Sugaya et al. | 356/401 |
| 5,757,505 A * | 5/1998 | Mizutani | 356/400 |
| 5,770,338 A * | 6/1998 | Lim et al. | 430/22 |
| 5,835,227 A * | 11/1998 | Grodnensky et al. | 356/399 |
| 5,965,309 A | 10/1999 | Ausschnitt et al. | |
| 6,440,616 B1 | 8/2002 | Izuha et al. | |
| 6,559,924 B2 | 5/2003 | Ina et al. | 355/53 |
| 6,563,573 B1 * | 5/2003 | Morohoshi et al. | 356/124 |
| 6,633,390 B2 | 10/2003 | Shiode et al. | |
| 6,636,303 B2 | 10/2003 | Ina et al. | 356/237.3 |
| 6,674,511 B2 | 1/2004 | Nomura et al. | |
| 6,765,647 B1 * | 7/2004 | Nishi | 355/55 |

(Continued)

FOREIGN PATENT DOCUMENTS

| | | |
|---|---|---|
| JP | 1-187817 | 7/1989 |
| JP | 8-264409 A | 10/1996 |

(Continued)

OTHER PUBLICATIONS

English translation of JP 2000-228345, published Aug. 15, 2000.*
Taiwan Office Action dated Aug. 29, 2012, issued in counterpart Taiwanese Patent Application No. 096145153, with an English translation.
US 6,150,664, 11/2000, Su (withdrawn)

*Primary Examiner* — Toan Ton
*Assistant Examiner* — Christina Riddle
(74) *Attorney, Agent, or Firm* — Fitzpatrick, Cella, Harper & Scinto

(57) ABSTRACT

A measuring apparatus which measures a substrate on which a mark formed with a resist is formed via lithography. An acquisition unit acquires information of an edge interval in an image of the mark under two different measurement conditions, and a calculation unit calculates a defocus value in the lithography based on a difference between the edge intervals of which information is acquired under the two different measurement conditions.

10 Claims, 19 Drawing Sheets

(56) References Cited

U.S. PATENT DOCUMENTS

| | | |
|---|---|---|
| 6,869,807 B2 | 3/2005 | Yoshitake et al. |
| 6,940,585 B2 | 9/2005 | Nomura et al. |
| 6,999,893 B2 | 2/2006 | Matsumoto et al. ......... 702/150 |
| 7,075,618 B2 | 7/2006 | Ina et al. ..................... 355/53 |
| 7,103,497 B2 | 9/2006 | Matsumoto et al. ......... 702/150 |
| 7,388,651 B2 | 6/2008 | Yabe ............................ 355/55 |
| 7,642,019 B2 | 1/2010 | Kim |
| 2002/0015158 A1* | 2/2002 | Shiode et al. ................ 356/614 |
| 2002/0182521 A1* | 12/2002 | Fujisawa et al. ............. 430/22 |
| 2004/0059540 A1* | 3/2004 | Matsumoto et al. ......... 702/150 |
| 2004/0075099 A1* | 4/2004 | Matsumoto et al. ......... 257/98 |
| 2005/0002035 A1* | 1/2005 | Mishima ...................... 356/401 |
| 2006/0103823 A1 | 5/2006 | Yabe ............................ 355/55 |
| 2006/0234136 A1 | 10/2006 | Kim |
| 2006/0241894 A1 | 10/2006 | Matsumoto et al. ......... 702/150 |
| 2007/0171392 A1 | 7/2007 | Matsumoto et al. ......... 355/77 |

FOREIGN PATENT DOCUMENTS

| | | |
|---|---|---|
| JP | 2000228345 A * | 8/2000 |
| JP | 2001-100392 A | 4/2001 |
| JP | 2002-55435 | 2/2002 |
| JP | 2002-289494 | 10/2002 |
| JP | 2003-142397 | 5/2003 |
| JP | 2006-140375 | 6/2006 |

* cited by examiner

F I G. 4
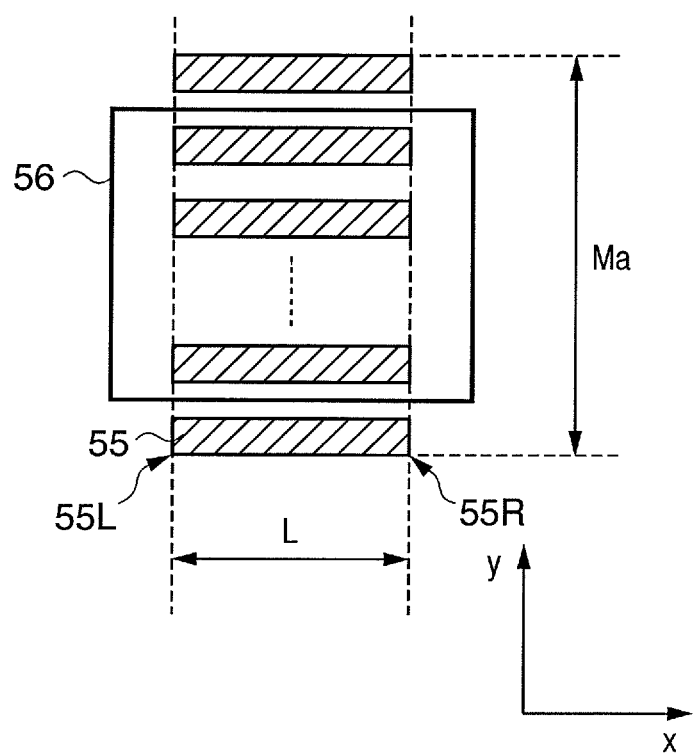

F I G. 9
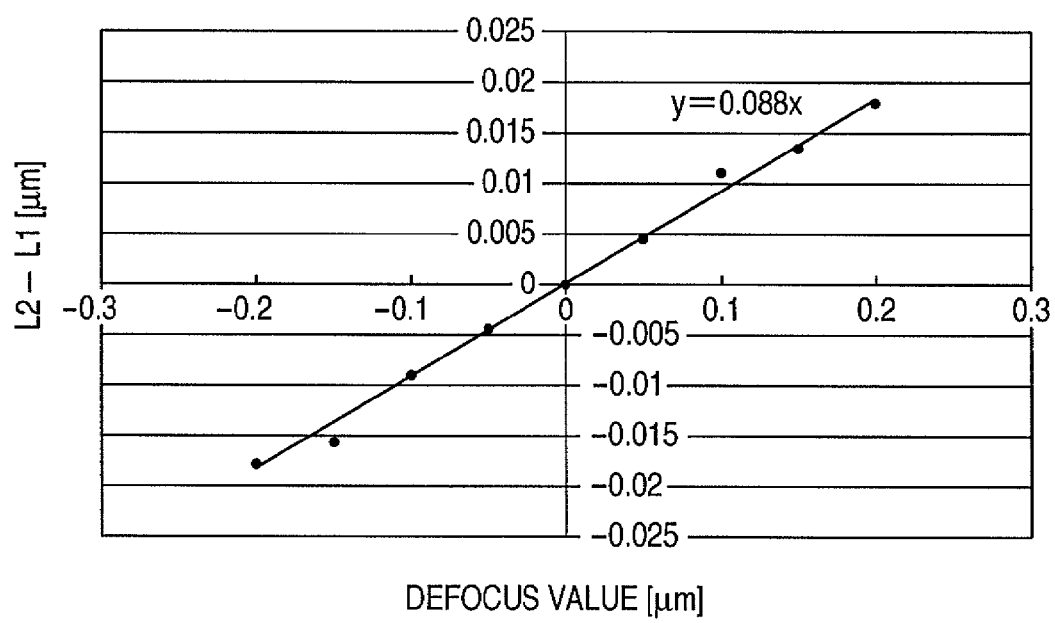

F I G. 16
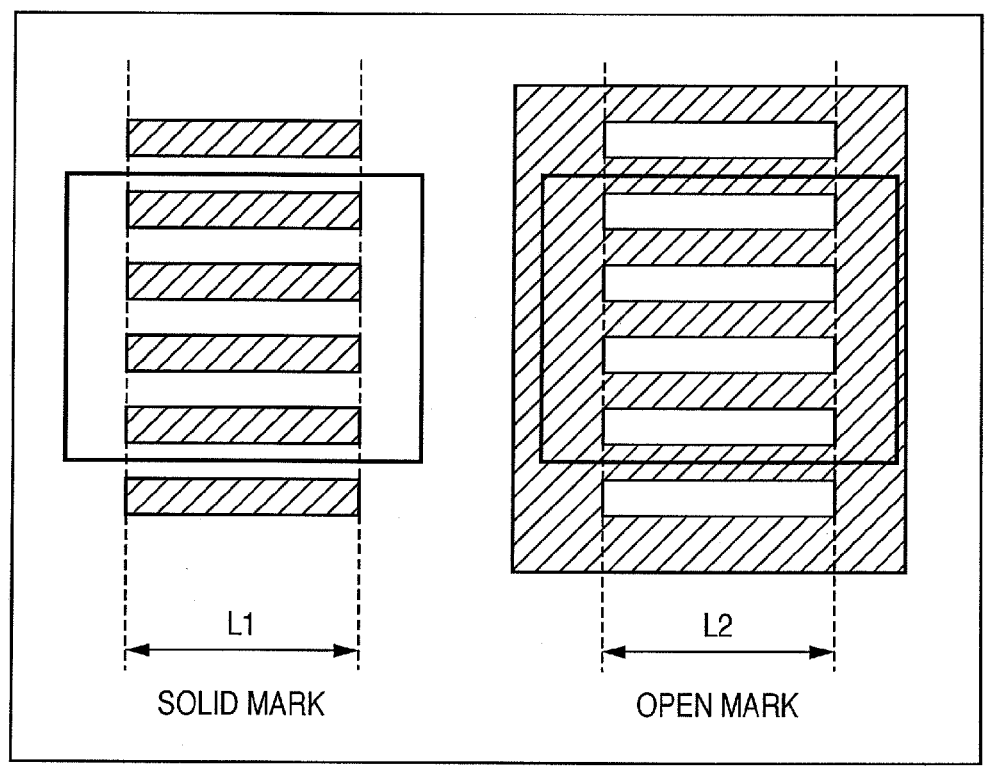

MEASURING APPARATUS AND PROJECTION EXPOSURE APPARATUS HAVING THE SAME

This application claims the benefit of Japanese Patent Application No. 2006-329915, filed Dec. 6, 2006, which is hereby incorporated by reference herein in its entirety.

BACKGROUND OF THE INVENTION

1. Field of the Invention

The present invention relates to a method and an apparatus for measuring a defocus value and an exposure light amount necessary for obtaining satisfactory imaging performance in a projection exposure apparatus that is used to manufacture, e.g., a semiconductor element, a liquid crystal display element, or a thin-film magnetic head by lithography. The present invention also relates to a method of controlling a measured defocus value and an exposure light amount. The present invention further relates to an exposure apparatus and a device manufacturing method capable of measuring and controlling a defocus value and an exposure light amount.

2. Description of the Related Art

To manufacture, e.g., a semiconductor element, a liquid crystal display element, or a thin-film magnetic head by lithography, a projection exposure apparatus is used, which forms a pattern image of a mask or a reticle (to be referred to as a "reticle" hereafter) on a photosensitive substrate through a projection optical system.

In recent years, the degree of integration of semiconductor elements has risen, and the process line width has decreased. To cope with this, a projection exposure apparatus uses a projection lens with a higher NA and a light source with a shorter wavelength and a larger angle of view. As a unit configured to achieve these, an apparatus called a stepper is used. A stepper reduces an almost square exposure area and exposes it to a wafer by cell projection. Another up and coming mainstream device is a scanning exposure apparatus called a scanner, which forms a rectangular slit-shaped exposure area and scans a reticle and a wafer relative to each other at a high speed, thereby accurately exposing a wide area. Under these circumstances, managing the defocus value and exposure light amount of the projection exposure apparatus is increasingly becoming important to maintain the allowable line width accuracy of a pattern as the numerical aperture (NA) of the projection lens rises, and the exposure wavelength shortens.

The following three methods are conventionally used to measure a defocus value.

(1) Registration marks are transferred and exposed to a wafer by using a special reticle, and the positions of the exposed registration marks are measured (Japanese Patent Laid-Open Nos. 2002-55435 and 2002-289494).

(2) A line length is measured by using LES (Line End Shortening) (Japanese Patent Laid-Open No. 1-187817 and U.S. Pat. No. 5,965,309).

(3) The sidewall angle information of a resist is measured using an SEM, an optical CD measuring device or an AFM (U.S. Pat. No. 6,150,664 and Japanese Patent Laid-Open No. 2003-142397).

The methods (2) and (3) can measure not only a defocus value, but also, an exposure light amount using the same mark.

However, these conventional techniques have the following problems.

In method (1), the light that has passed through the registration mark must form an asymmetrical incidence angle distribution on the wafer. For example, in Japanese Patent Laid-Open No. 2002-55435, registration marks on the reticle have a phase difference of 90°. In Japanese Patent Laid-Open No. 2002-289494, a special reticle prepared by, e.g., forming patterns on both surfaces is used. This makes it difficult to form both an element pattern and registration marks on a reticle. Hence, this method is not suitable for measuring the focus and exposure light amounts of an element pattern in a mass production line. The method is usable only for, e.g., periodic maintenance of the curvature of field of a projection exposure apparatus.

Method (2) requires no special reticle and allows measurement using a relatively inexpensive measuring device. However, the line length of the measurement target exhibits a parabolic behavior on both sides of the best focus position. For this reason, although it is possible to measure the absolute value of the defocus value, the sign of the value is unknown. To determine the sign of focus, it is necessary to change the focus by a predetermined amount, to execute exposure and light length measurement again, and then, to determine the sign on the basis of the increase or the decrease in the line length.

Method (3) requires an expensive measuring device, such as an optical CD (Critical Dimension) measuring device or an AFM to execute measurement in the CD direction, unlike the methods (1) and (2), which execute measurement using an optically sensed image. This poses a problem in the measurement accuracy as the pattern becomes small.

A prior art arrangement and its associated problem will be described in detail with reference to FIGS. 18A to 18C and 19. FIGS. 18A to 18C are graphs, each showing the relationship between the defocus value and the pattern length. The abscissa represents the defocus value, and the ordinate represents the pattern length. FIG. 19 is a view for explaining the focus amount or the exposure light amount measurement method disclosed in Japanese Patent Laid-Open No. 1-187817. As shown in FIG. 19, wedge-shaped registration marks RP are transferred and exposed to a wafer. Then, a slit beam SP scans in the direction of the arrow. A pattern length Ly is obtained from the diffracted light intensity. When the focus position of the exposure apparatus changes, the pattern length Ly, which has a characteristic such as a quadratic function, reaches the maximum at the best focus position and decreases as the light defocuses, as shown in FIG. 18A. Such a focus characteristic curve is acquired in advance, and the pattern length Ly of the registration mark RP on the exposed wafer, as the inspection target, is measured. When only the pattern length Ly=Ly1 is measured, two values F1 and F2 are available as the focus inspection values, as shown in FIG. 18B. It is, therefore, impossible to determine the inspection value corresponding to the pattern length. Conventionally, as shown in FIG. 18C, after the focus position of the exposure apparatus is moved by dF from that in the first exposure, the registration marks are exposed, and the pattern length Ly is measured again. If the pattern length Ly of the second time is Ly2, the focus inspection value of the first time is determined to be F1. If the pattern length Ly is Ly2', the focus inspection value of the first time is determined to be F2. That is, in the conventional inspection method using Line End Shortening, only one exposure process is insufficient to determine the sign of focus because of the quadratic function-like characteristic with the maximal value at the best focus position. Additionally, since the pattern length change characteristic has a quadratic function with the maximal value at the best focus position, and the change in the pattern length near the best focus position is small, the resolution in focus measurement lowers.

As described above, there is no measuring method or apparatus having a sufficient function as an inline focus monitor (or inline exposure light amount monitor), which inspects the focus amount and exposure light amount and appropriately corrects them in accordance with a secular change, in a semiconductor manufacturing mass production line.

SUMMARY OF THE INVENTION

The present invention has been made in consideration of the above-described problem in focus measurement near the best focus position, and has as its object to execute appropriate focus measurement even in such a case.

According to a first aspect, the present invention provides a measuring apparatus that measures a substrate on which a registration mark is formed, the apparatus comprising an acquisition unit configured to acquire edge interval information of the image of the registration mark sensed under a measurement condition that is changed to make the edge interval of the image of the registration mark have an extreme value corresponding to a different focus position of a projection exposure apparatus, and a calculation unit configured to calculate a defocus value on the basis of the edge interval information of the image of the registration mark sensed under each measurement condition.

According to a second aspect, the present invention provides a projection exposure apparatus comprising an optical system which projects, to the substrate, exposure light to irradiate an original having a pattern, a stage unit which holds and locates one of the substrate and the original, and the above-described measuring apparatus.

According to a third aspect, the present invention provides a measuring apparatus which measures a defocus value of a projection exposure apparatus on the basis of a mark formed on a substrate through exposure by the projection exposure apparatus. The apparatus comprises an image sensing unit configured to sense the mark, and a process unit configured to execute a process to obtain an interval between two edges of an image of the mark obtained by the image sensing unit under each of a plurality of conditions and to calculate the defocus value on the basis of the interval obtained for each of the plurality of conditions.

According to a fourth aspect, the present invention provides a projection exposure apparatus which has a projection optical system and exposes a substrate through an original and the projection optical system. The apparatus comprises the above-described measuring apparatus which measures a defocus value of the projection exposure apparatus on the basis of a mark formed on a substrate through exposure by the projection exposure apparatus, a stage which holds and moves one of the original and the substrate, and a control unit configured to control a position of the stage in a direction of an optical axis of the projection optical system, on the basis of the defocus value measured by the measuring apparatus.

Further features of the present invention will become apparent from the following description of exemplary embodiments (with reference to the attached drawings).

BRIEF DESCRIPTION OF THE DRAWINGS

FIG. 4 is a view for explaining a focus/exposure light amount registration mark used in the present invention;

FIG. 9 is a graph showing the relationship between the defocus value and the difference between two line length measurement values;

FIG. 16 is a view showing registration marks used in the fourth preferred embodiment of the present invention;

DESCRIPTION OF THE EMBODIMENTS

Figure 1A:
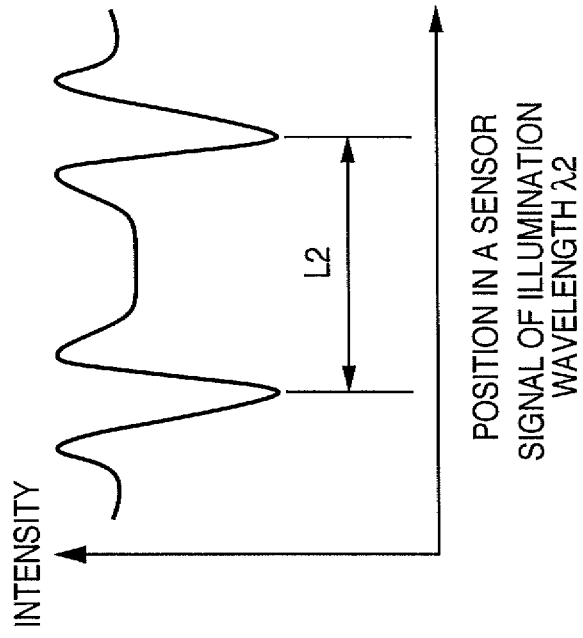
FIGS. 1A and 1B are graphs for explaining signal waveforms acquired in the first preferred embodiment of the present invention.

The preferred embodiments of the present invention will be described below in detail with reference to the accompanying drawings. The same reference numerals denote the same constituent elements.

First Embodiment

Figure 5:
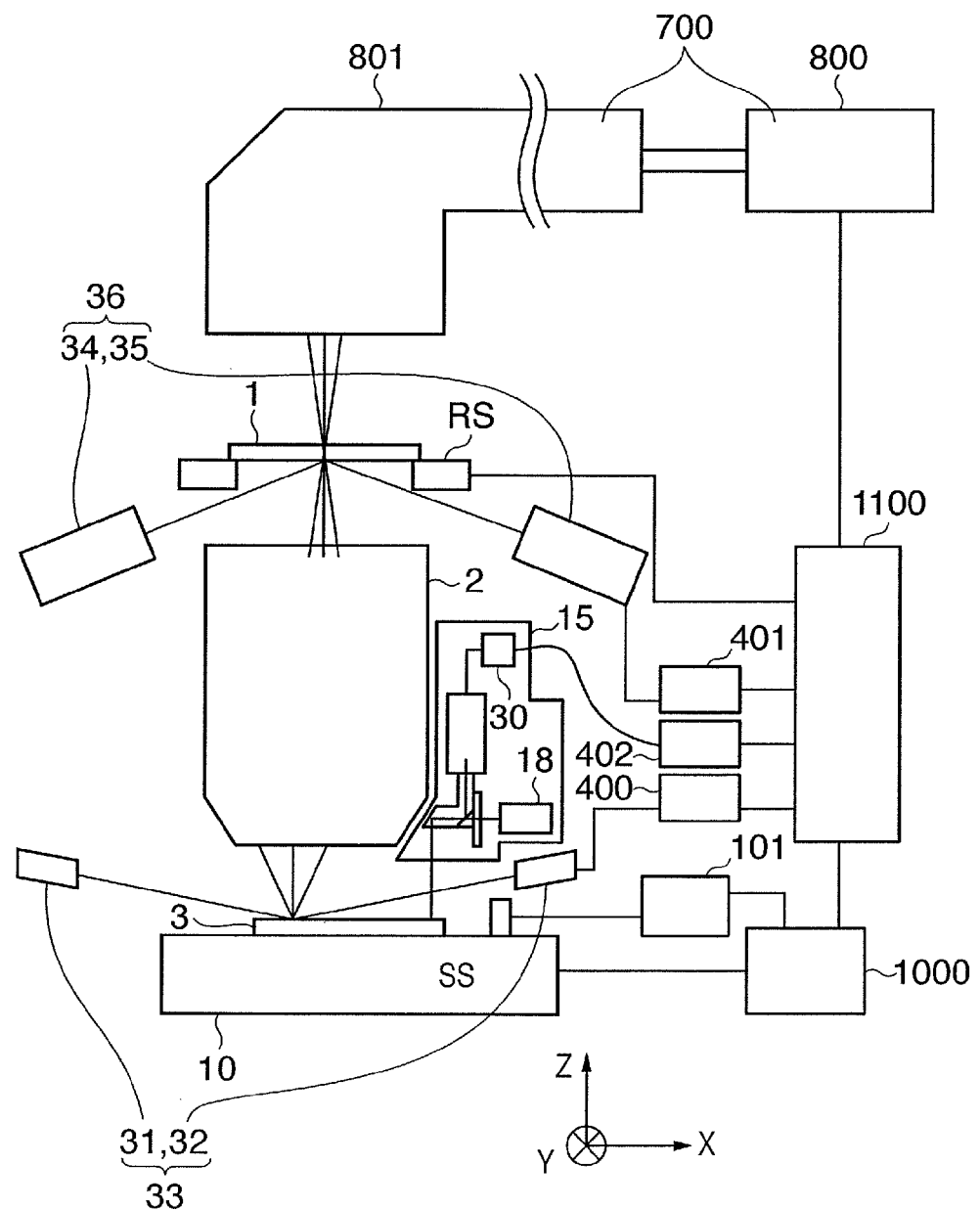
FIG. 5 is a view of a projection exposure apparatus used in the present invention.

FIG. 5 is a view showing a projection exposure apparatus according to the first preferred embodiment of the present invention. A projection exposure apparatus 10 exposes a circuit pattern formed on a reticle 1 to a substrate 3, such as a wafer, by a step-and-scan method. The projection exposure apparatus 10 is suitable for performing lithography on the order of submicron or quarter microns, or less. As shown in FIG. 5, the projection exposure apparatus 10 includes an illumination apparatus 700, a reticle stage RS with a reticle (also called an original) 1 placed on it, and a projection optical system 2. The projection exposure apparatus 10 also has a substrate stage SS with the substrate 3 placed on it, a focus/tilt detection system 33, an arithmetic processing unit 400 of the focus/tilt detection system 33, an alignment detection optical system 15, and an alignment signal processing system 402 serving as the arithmetic processing unit of the alignment detection optical system 15. A control unit 1100 having a CPU and a memory is electrically connected to a light source 800, a reticle stage RS, a substrate stage SS, a focus/tilt detection system 33, and an alignment detection optical system 15, and controls the respective units of the projection exposure apparatus 10. The control unit 1100 also executes a measurement value correction operation and control when the focus/tilt detection system 33 detects the surface position of the substrate 3, and a measurement value correction operation and control when the alignment detection optical system 15 detects the in-plane position of the substrate 3.

The illumination apparatus 700 has a light source 800 and an illumination optical system 801, and illuminates the reticle 1 having a circuit pattern to be transferred. The light source 800 uses, e.g., a laser. Examples of the laser are an ArF excimer laser having a wavelength of about 193 nm and a KrF excimer laser having a wavelength of about 248 nm. However, the light source is not limited to an excimer laser. For example, an $F_2$ laser having a wavelength of about 157 nm or EUV (Extreme Ultra Violet) light having a wavelength of 20 nm or less may also be used.

The illumination optical system 801 is an optical system for illuminating an illumination target surface with a light beam emitted from the light source 800. The illumination optical system 801 shapes the light beam into an exposure slit with a predetermined optimum shape, and illuminates the reticle 1. The illumination optical system 801 includes a lens, a mirror, an optical integrator, and a stop, and has an arrangement with e.g., a condenser lens, a fly-eye lens, an aperture stop, a condenser lens, a slit, and an imaging optical system, being arranged in this order. The illumination optical system 801 can use both on-axis light and off-axis light. The optical integrator includes an integrator formed by stacking a fly-eye lens and two cylindrical lens arrays (or lenticular lenses). However, an optical rod or a diffractive optical element may replace the optical integrator.

The reticle 1 is made of, e.g., quartz, and has, on it, a circuit pattern to be transferred. The reticle stage RS supports and drives the reticle 1 in a predetermined direction. Diffraction light that has passed through the reticle 1 passes through the projection optical system 2 and is projected to the substrate 3. The reticle 1 and substrate 3 have an optically conjugate relationship. The pattern of the reticle 1 can be transferred to the substrate 3 by scanning the reticle 1 and substrate 3 at a speed ratio corresponding to the reduction ratio. Note that the projection exposure apparatus 10 has a reticle detection system 36 of a light oblique incidence system. The reticle detection system 36 detects the position of the reticle 1, so that it is arranged at a predetermined position.

The reticle stage RS supports the reticle 1 through a reticle chuck (not shown) and is connected to a moving mechanism (not shown). The moving mechanism including, e.g., a linear motor, can move the reticle 1 by driving the reticle stage RS in the X-, Y-, and Z-directions, and in the rotational directions about these axes.

The projection optical system 2 has a function of forming, on an image plane, the image of a light beam from an object surface. The projection optical system 2 forms, on the substrate 3, the image of diffraction light that has passed through the pattern formed on the reticle 1. An optical system, including only a plurality of lens elements, an optical system (catadioptric optical system), including a plurality of lens elements and at least one concave mirror, or an optical system, including a plurality of lens elements and at least one diffractive optical element, such as a phase hologram, can serve as the projection optical system 2.

The substrate 3 is a processed body and has a photoresist applied to the surface. In this embodiment, the substrate 3 is a processed body whose position is detected by the focus/tilt detection system 33. In another embodiment, a liquid crystal substrate or another processed body can replace the substrate 3.

The substrate stage SS supports the substrate 3 through a wafer chuck (not shown). The substrate stage SS moves the substrate 3 in the X-, Y- and Z-directions and in the rotational directions about these axes by using a linear motor, like the circle stage RS. For example, a laser interferometer 101 monitors the positions of the reticle stage RS and the substrate stage SS. The reticle stage RS and the substrate stage SS are driven at a predetermined speed ratio. The substrate stage SS is provided on, e.g., a stage base that is supported on the floor via a damper. The reticle stage RS and projection optical system 2 are provided on, e.g., a lens barrel surface plate (not shown) that is supported, via a damper, on a base frame placed on the floor.

The focus/tilt detection system 33 detects the position information of the surface position (Z-direction) of the substrate 3 during exposure by using an optical measuring system. The focus/tilt detection system 33 makes light beams strike a plurality of measurement points on the substrate 3, guides the light beams to individual sensors, and detects the tilt of the exposure surface based on positional information (measurement results) of the different positions.

Figure 2:
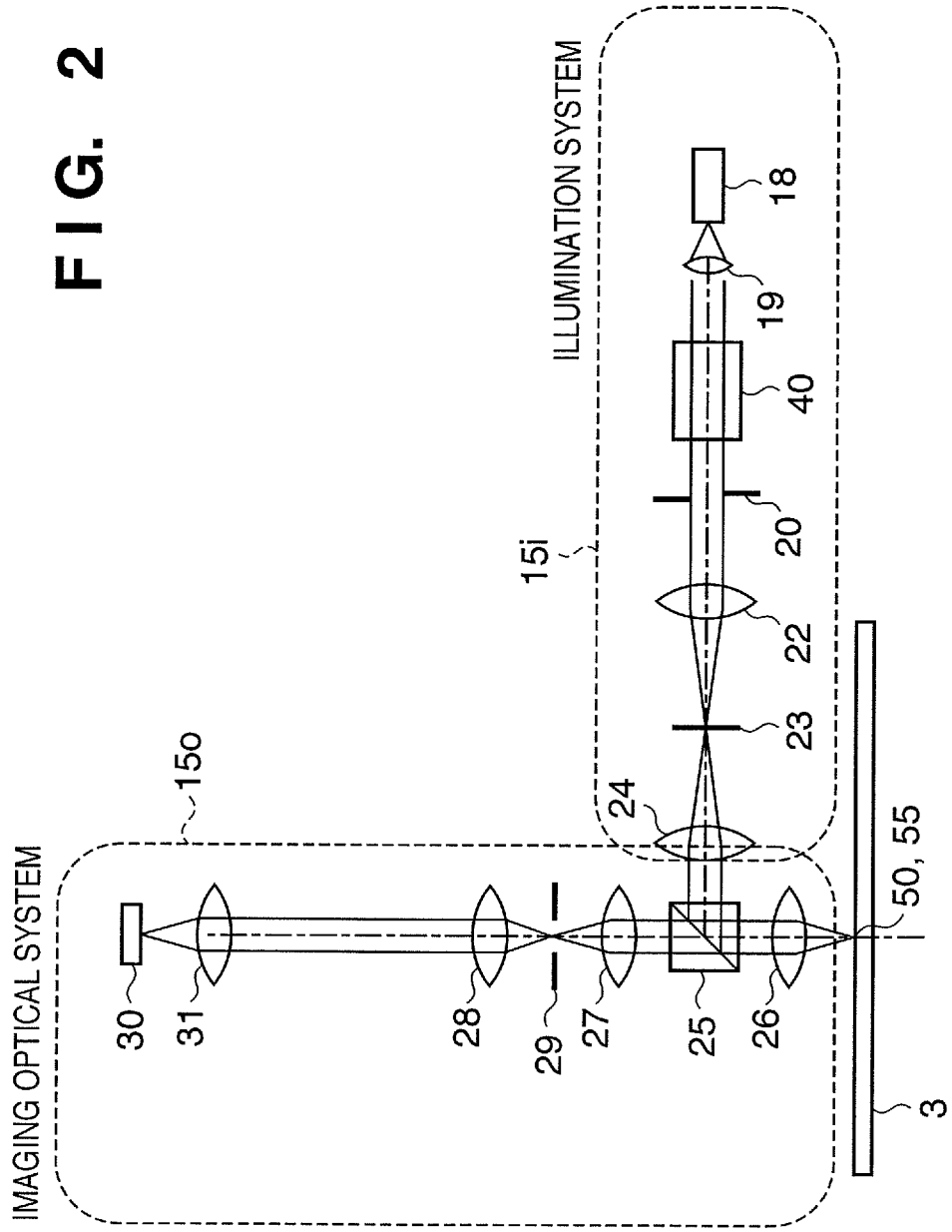
FIG. 2 is a view for explaining a measuring apparatus used in the first preferred embodiment of the present invention.

The alignment detection system will be described next. In this embodiment, the alignment detection system is used not only for alignment detection, but also, for detection of focus/exposure light amount registration marks. FIG. 2 is a view showing the major constituent elements of the alignment detection optical system 15. FIG. 2 illustrates an example of an optical system for detecting direction. The X-direction detection system will be explained below. For the Y direction, the system is rotated through 90° about the Z-axis. For the Y direction, a mark for the X direction is rotated through 90° about the Z-axis and is used as an alignment mark. An area sensor may be used to detect the X-direction mark and the Y-direction mark.

The alignment detection optical system 15 includes an illumination system 15*i* and an imaging optical system 15*o*. A lens 19 enlarges illumination light from a light source 18 and forms a parallel beam. The parallel beam passes through a wavelength selection unit 40 for selectively passing an arbitrary wavelength, and a lens 22 condenses the light again. It is possible to adjust the coherence (o) of illumination light by adjusting an aperture stop 20. An aperture 23 exists at a position conjugate to the substrate 3 and serves as a field stop that prevents unnecessary light from illuminating the peripheral region of an alignment mark on the substrate 3. A lens 24 returns the light condensed by the lens 22 to a parallel beam again. A beam splitter 25 reflects the light so that it illuminates an alignment mark 50 on the substrate 3 through a lens 26. The light reflected by the alignment mark 50 passes through the lens 26, beam splitter 25, and lenses 27 and 28, and enters a line sensor 30. The line sensor 30 is designed to condense light by a cylindrical lens (not shown) having power in a direction perpendicular to the alignment detection direction.

A stop 29 provided at a position conjugate to the surface of the substrate 3 processes only a predetermined region of the alignment mark 50. The alignment mark 50, enlarged at an imaging magnification of about 100% to 400%, forms an image on the line sensor 30.

Figure 3:
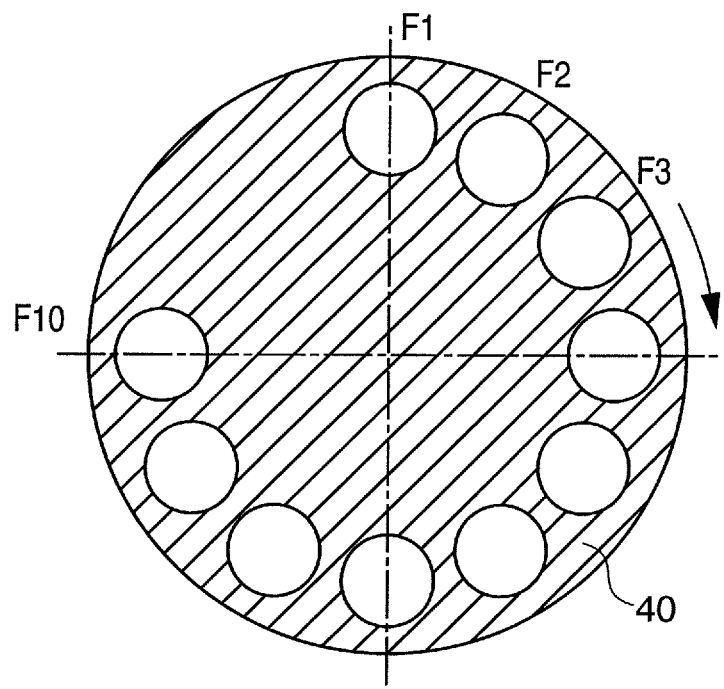
FIG. 3 is a view for explaining the arrangement of the tunable unit of the measuring apparatus used in the first preferred embodiment of the present invention.

The wavelength selection unit 40 has ten bandpass interference filters F1 to F10 on the same radius of a disc, as shown in FIG. 3. The wavelength selection unit 40 is designed to illuminate the alignment mark with an arbitrary wavelength by rotating the disc and locating an arbitrary bandpass interference filter on the optical path of the illumination light. An optimum illumination wavelength is selected in accordance with the vertical structure of the alignment mark on the wafer. The numerical aperture (NA) of the alignment scope is about 0.4 to 0.9. A wavelength not to expose the resist is used.

Figure 11A:
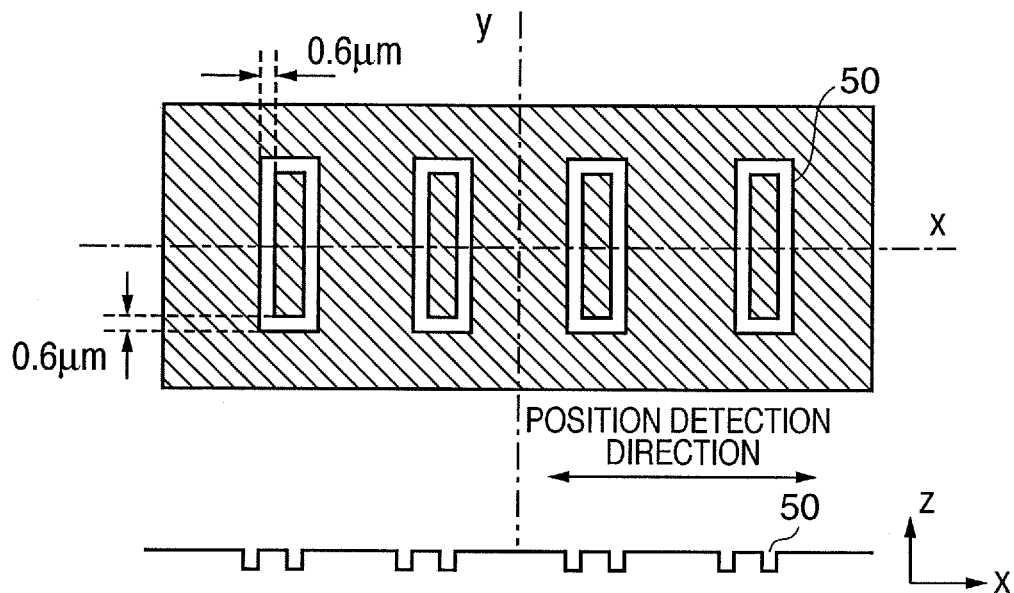
FIGS. 11A and 11B are views showing the shape of alignment marks used in the present invention.
Figure 11B:
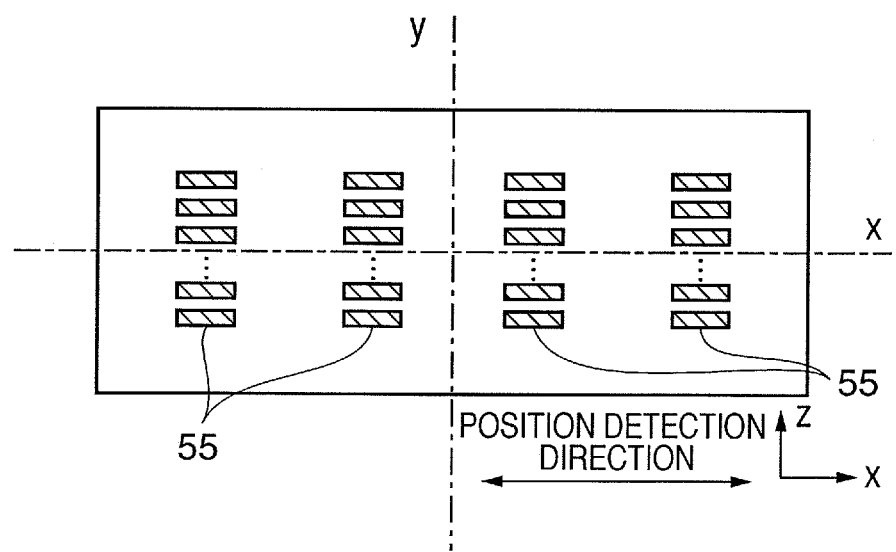
Figure 12:
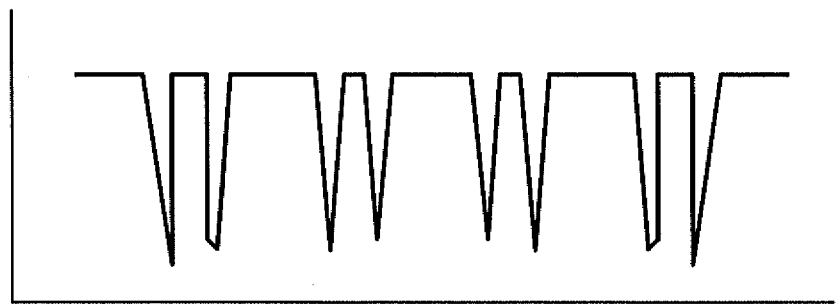
FIG. 12 is a graph showing an alignment signal waveform of the present invention.

As the alignment mark 50, a mark having a shape shown in FIG. 11A or 11B is used. In FIG. 11A, four rectangular marks each having a length of 4 µm in the X direction as the measurement direction and a width of 30 µm in the Y direction as the non-measurement direction are arrayed in the X direction at a pitch of 20 µm. Each alignment mark 50 is etched so as to have a rectangular outline surrounded by a 0.6-µm wide line. Actually, the alignment mark 50 has a resist on it, though the resist is not illustrated, for descriptive convenience. When the alignment marks 50 in FIG. 11A are used, scattered light having a large angle outside the NA of the lens of the alignment detection optical system 15 is generated and interferes at the edges. For this reason, an image as shown in FIG. 12 is formed on the line sensor 30. The alignment mark 50 in FIG. 11A forms a dark or bright concave portion. Such an image is often observed in a bright field image.

Figure 13:
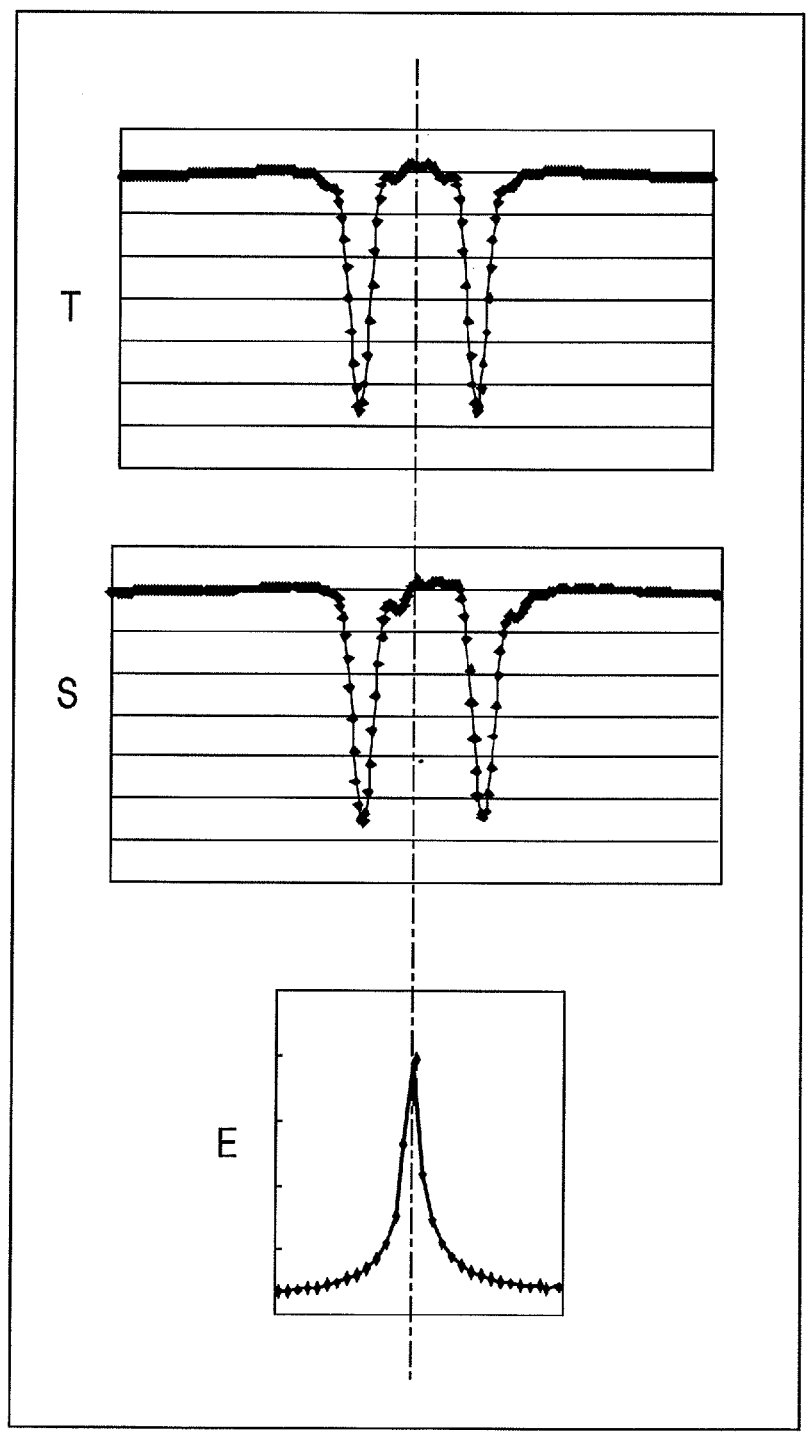
FIG. 13 is a view for explaining an alignment signal waveform processing method of the present invention.

The alignment signal processing system 402 processes the sensed image of the alignment mark 50 in the following way. The position of the alignment mark 50 is calculated by template matching. Template matching is a correlation operation between an acquired signal (S in FIG. 13) and a template (T in FIG. 13) held in the apparatus in advance. A position having the highest correlation is detected as the center of the alignment mark. In a correlation value function E in FIG. 13, the barycentric pixel position in a region of several left and right pixels from the peak pixel is obtained, thereby achieving a resolution of 1/10 to 1/50 pixels. Template matching is executed in accordance with $$E(X) = \frac{1}{\sum_{j=k}^{k} [S(X+J) - T(J)]^2} \quad (1)$$

where S is the signal acquired by the sensor, T is the template and E is the correlation result. FIG. 13 illustrates the relationship between the signal S, template T, and correlation value E. FIG. 13 shows the process result of one of the images of the four alignment marks. The positions of the remaining three alignment mark images on the sensor are also detected by template matching. Positions X1(n), X2(n), X3(n), and X4(n) of the four alignment mark images are obtained by template matching (the unit is a "pixel"), where n is the template number. Then, the average position of the marks is calculated by $$Xa(n) = [X1(n) + X2(n) + X3(n) + X4(n)]/4 \quad (2)$$

Let M be the imaging magnification of the alignment detection optical system 15, such as an alignment scope, and Px by the pixel pitch of the area sensor in the alignment measurement direction. At this time, a registration Xw(n) of the alignment mark 50 on the wafer, which is obtained by each template, is given by:

$$Xw(n) = Xa(n)/(Px \cdot M). \quad (3)$$

Based on equation (3), a misregistration amount X1 of the alignment mark from the best focus image signal obtained by the line sensor 30 is calculated.

As described above, the projection exposure apparatus 10 controls the position of the substrate stage SS in association with the tilt or optical axis direction of the projection optical system 2, on the basis of substrate surface position information detected by the focus/tilt detection system under the control of the control unit 1100. This aligns the substrate position to the best focus plane of the projection optical system of the projection exposure apparatus 10. Alignment is executed based on the in-plane misregistration amount of the wafer measured by the alignment detection system. After that, the pattern on the reticle is transferred and exposed on the wafer. The arrangements and functions of the major parts of the projection exposure apparatus 10 have been described above.

Figure 10:
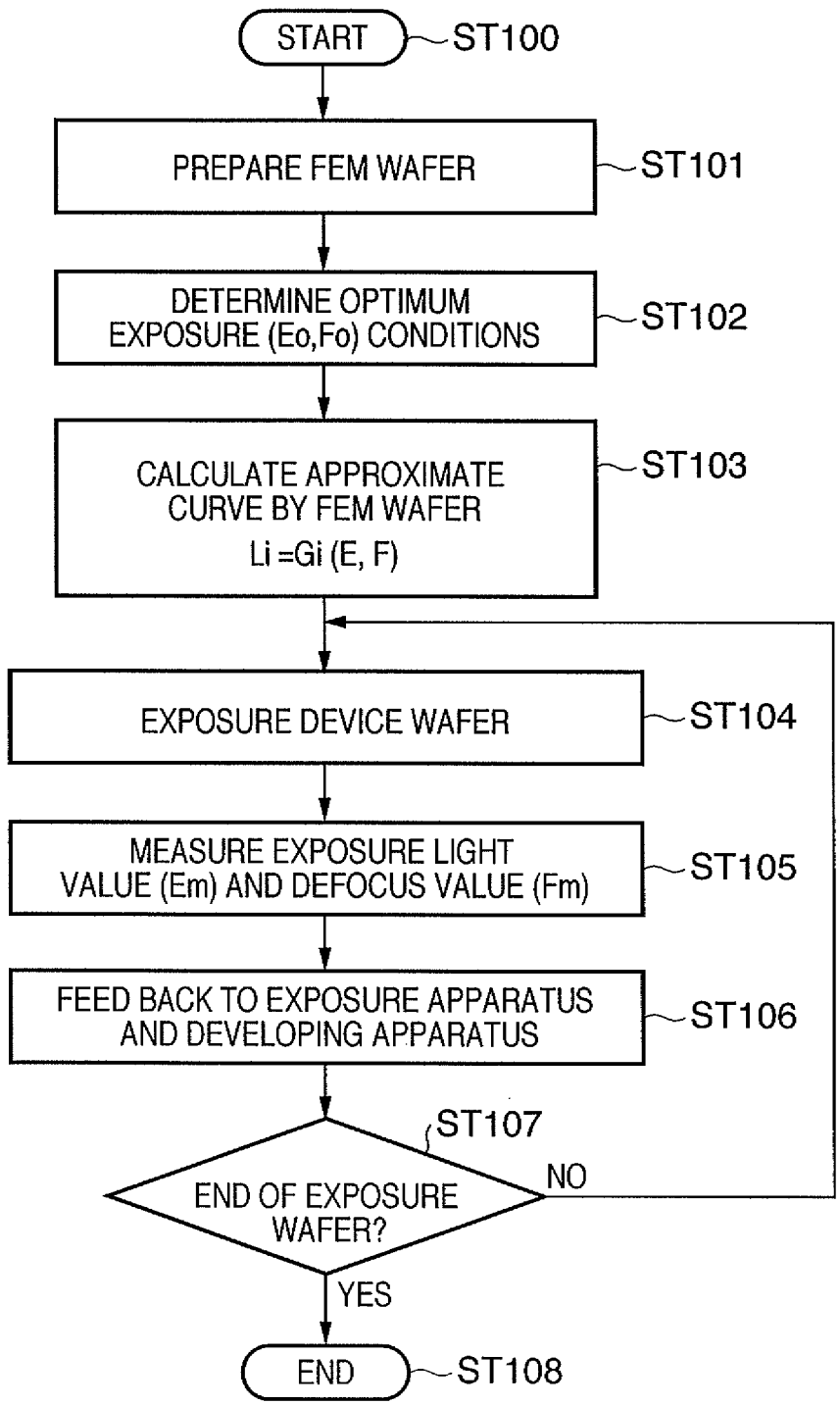
FIG. 10 is a flowchart illustrating the sequence of the present invention.

A focus/exposure light amount measuring method according to this embodiment will be described next. The outline of a defocus value/exposure light amount measuring method and a correction method according to the preferred embodiment of the present invention will be explained with reference to the flowchart in FIG. 10.

Figure 6:
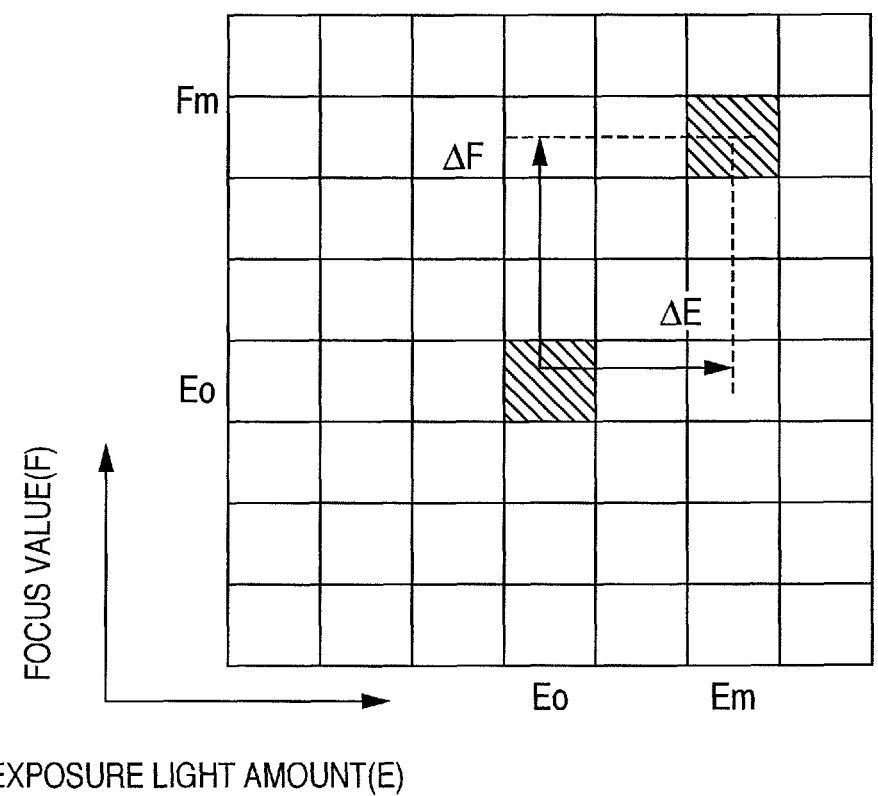
FIG. 6 is a view for explaining an FEM wafer used in the present invention and a deviation from an optimum exposure condition.

In step ST101, a registration mark (FIG. 4) on a reticle is exposed while changing the focus value (focus position) (F) and exposure light amount (E) of the projection exposure apparatus 10 on a wafer, as shown in FIG. 6, thereby preparing an FEM (Focus Exposure Matrix) wafer. The reticle used at this time has both an actual element pattern and the registration mark formed in an area corresponding to a scribe line, which are simultaneously exposed.

In step ST102, the actual element pattern on the wafer is evaluated using, e.g., an SEM. An optimum focus value Fo and an optimum exposure light amount Eo are obtained on the basis of optimum exposure conditions, including a focus value and an exposure light amount, to form an actual element pattern with a design value or a central focus value and a central exposure light amount, with respect to a focus variation and an exposure light amount variation.

In step ST103, the FEM wafer is loaded into the projection exposure apparatus 10. The alignment detection system measures a line length L(E, F) of the registration mark exposed on the basis of the exposure light amount E and focus value F, and calculates the relational expression (approximate curve) of the line length L and the exposure light amount/focus value.

In step ST104, the projection exposure apparatus 10 exposes a device pattern and a registration mark to the wafer by using a reticle having the device pattern and the registration mark.

In step ST105, the registration mark is measured, and the exposure light amount and focus value are determined based on the relational expression obtained in step ST103.

In step ST106, an offset is given to the projection exposure apparatus 10, developing apparatus, or etching apparatus, to correct the deviations of the measured exposure light amount and the focus value from the optimum exposure conditions (Eo, Fo).

In step ST107, it is determined whether another wafer as an exposure target exists. If a wafer exists, the process returns to step ST104, to repeat the above-described process, until exposure is done for all wafers.

Detailed implementation contents of the process will be described below. FIG. 4 is a view showing a focus value/exposure light amount registration mark 55 used in the preferred embodiment of the present invention. As shown in FIG. 4, the registration mark 55 is formed from rectangular lines and spaces. The line width and space width are 0.15 µm on the substrate. The design value of the line length L on the substrate 4 is µm. The number of lines and spaces is preferably ten or more. The length of the array direction of the rectangular patterns is 30 µm on the substrate. The duty ratio of the lines and spaces is preferably 0.5. However, the present invention is not limited to this. The line width and space width are preferably equal to or about three times the minimum width of the pattern to be transferred and exposed to the substrate. A plurality of patterns shown in FIG. 4 may be arranged. For example, it is possible to arrange the registration marks 55 shown in FIG. 4 in the horizontal direction at a predetermined pitch and to use them as alignment marks, as shown in FIG. 11B. In this case, the number of line lengths to be measured increases (four line lengths are measured in FIG. 11B). The measurement accuracy can be improved by using the average value of the line lengths. Note that when the reduction magnification of the projection exposure apparatus 10 is ¼, the line width is 0.6 and the line length is 16 μm on the reticle.

A method of measuring the registration mark 55 will be described next. In this embodiment, measurement is done by using the above-described alignment detection system of the projection exposure apparatus 10. An inspection substrate is placed on the projection exposure apparatus 10. The alignment detection optical system 15 senses the registration mark 55. The cylindrical lens in the alignment detection optical system 15 condenses the image of the registration mark 55 in an effective process area 56 shown in FIG. 4, which is defined by the stop 29, so that the image is output as a signal integrated in the Y direction. With this process, a signal waveform having at least two extreme values (peaks or bottoms) corresponding to the edges (55L and 55R) on both sides of the line of the registration mark is obtained, as shown in FIG. 1A.

To calculate the edge positions to obtain the line length, the positions of the extreme values are obtained by approximating the functions of several points before and after the extreme values generated by the edges of the registration mark. Alternatively, the median of the two intersections between a predetermined slice level and the signal waveform near the extreme values is obtained.

As shown in FIG. 6, the registration mark is exposed in advance while changing the focus value (F) and the exposure light amount (E) of the projection exposure apparatus 10 on the substrate, thereby preparing an FEM substrate. The reticle used at this time has both an actual element pattern and the registration mark formed in an area corresponding to a scribe line, which are simultaneously exposed.

Figure 1B:
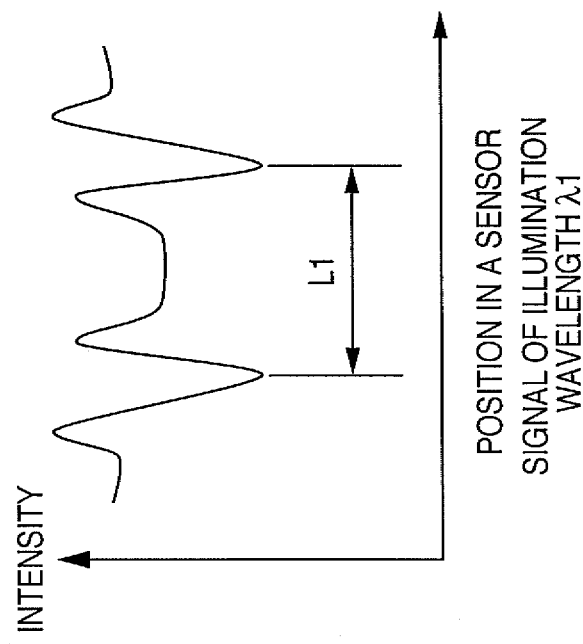

The actual element pattern on the substrate is evaluated using, e.g., an SEM. The optimum focus value Fo and the optimum exposure light amount Eo are obtained on the basis of optimum exposure conditions, including a focus value and an exposure light amount, to form an actual element pattern with a design value or a central focus value and a central exposure light amount with respect to a focus variation and an exposure light amount variation. On the other hand, for the registration mark, the FEM substrate is loaded onto the projection exposure apparatus 10. The alignment detection system measures the line length L(E, F) of the registration mark exposed based on the exposure light amount E and focus value F by the above-described method. In this embodiment, the registration mark corresponding to each focus value and exposure light amount is measured while the wavelength selection unit 40 of the alignment detection optical system 15 changes the illumination wavelength at this time. That is, for one registration mark, different signal waveforms are obtained in correspondence with each illumination wavelength, as shown in FIGS. 1A and 1B. For example, let L1(E, F) be the measurement value of the edge interval (line length) at an illumination wavelength λ1, and L2(E, F) be the measurement value of the edge interval (line length) at an illumination wavelength λ2. In this case, characteristic curves as shown in FIG. 7 are obtained.

Figure 7:
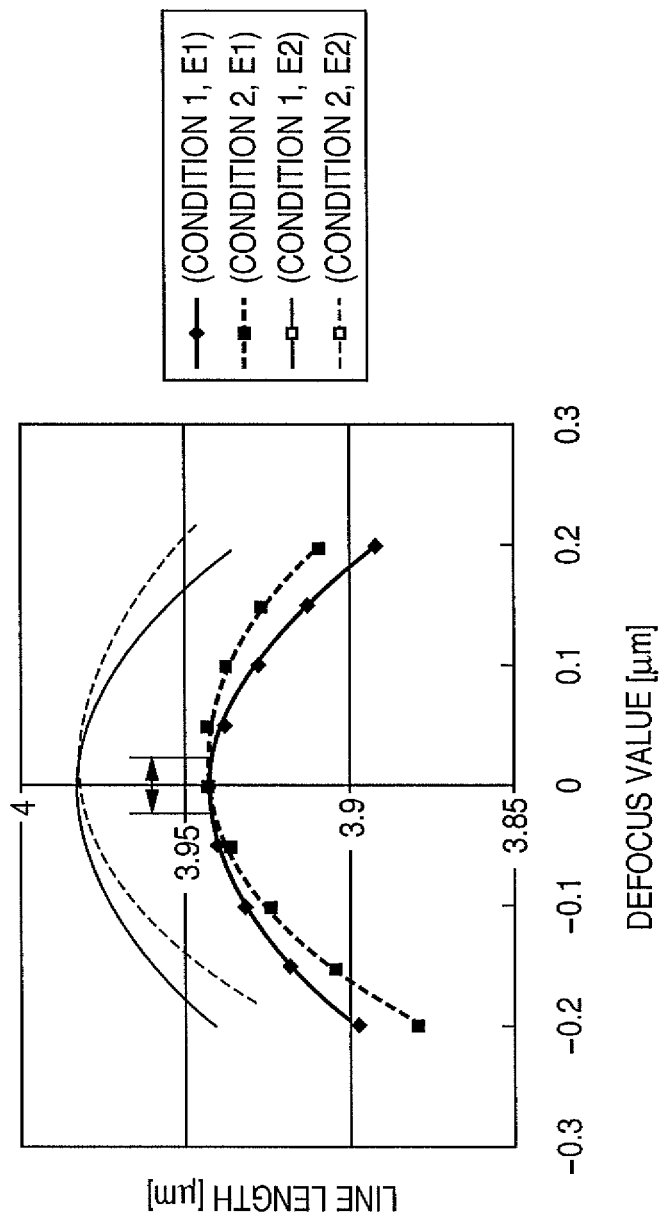
FIG. 7 is a graph showing the pattern length difference based on two measurement conditions as a point of the present invention.
Figure 8:
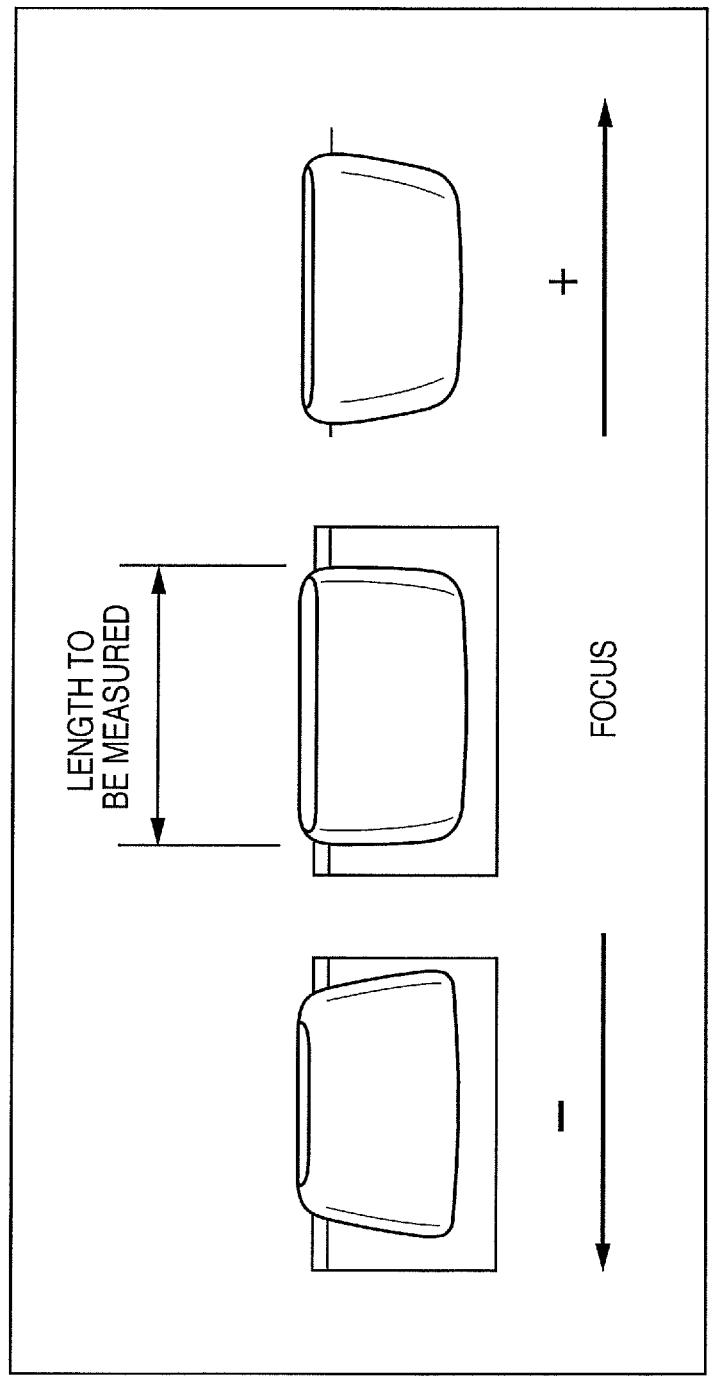
FIG. 8 is a view showing the defocus characteristic of a rectangular resist pattern.

Referring to FIG. 7, condition 1 corresponds to the illumination wavelength λ1, and condition 2 corresponds to the illumination wavelength λ2. E1 and E2 represent exposure light amounts. The experiments and resist simulations by the present inventor have revealed that each of the line lengths L1 and L2 varies similar to a quadratic function with respect to a defocus value, and the focus position exhibiting the maximum value changes depending on the illumination wavelength. FIG. 8 is a bird's-eye view showing the simulation result of the resist shape of one rectangular element of the registration mark. Resist edge retreat and a change in the edge tilt angle occur on the − and + defocus sides of the projection exposure apparatus 10.

Upon sensing the mark from the upper side, the formed signal receives the effect of interference on the upper and lower surfaces of the edges. For this reason, the focus position corresponding to the maximum position changes depending on the illumination wavelength. On the other hand, when the exposure light amount changes, the line length exhibits an almost linear variation independently of the illumination wavelength.

An effect obtained by using the two pieces of line length information (L1 and L2), each having a maximum value changing depending on the focus, will be described next with reference to FIG. 9. FIG. 9 shows the difference between L1 and L2, i.e., L2(E1, F)−L1(E1, F) obtained by using the characteristics in FIG. 7 corresponding to the exposure light amount E1. The difference (L2−L1) has a linear relationship with respect to the defocus value (the difference exhibits an odd function with respect to focus, although L1 and L2 exhibit even functions). It is, therefore, possible to obtain defocus values with signs. In a normal focus measuring method, the change in the registration mark shape becomes small near the best focus position, and the measuring resolution decreases. However, when the difference is used, the measuring resolution does not change depending on the defocus value. The difference (L2−L1) changes by about 90 nm when the defocus value changes by 1 μm. Hence, if the line length measurement accuracy is about 2 nm, the focus measuring resolution is (1 μm/90)×2=about 20 nm.

The method of calculating the focus value and the exposure light amount will be described below in detail by using numerical expressions. First, the line length L1 obtained by measuring the FEM substrate at the illumination wavelength λ1 and the line length L2 obtained at the illumination wavelength λ2 are approximate to:

$$L1(E,F) = k1 + ke \cdot E + kf1 \cdot F + kf \cdot F^2 \quad (4)$$

$$L2(E,F) = k2 + ke \cdot E + kf2 \cdot F + kf \cdot F^2. \quad (5)$$

The coefficients in equations (4) and (5) can be obtained easily by the least-squares method using the line length measurement values L1 and L2, the exposure light amount variable E and the focus value F given to the projection exposure apparatus 10 in preparation, and the FEM substrate. Conversely, the focus value F is given by equation (5)-equation (4), i.e., $$F = \{(L2 - L1) - (k2 - k1)\}/(kf2 - kf1) \quad (6)$$

On the other hand, the exposure light amount E is obtained by substituting equation (6) into equation (4), $$E = \{L1 - (k1 + Kf1 \cdot F + kf \cdot F^2)\}/k1 \quad (7)$$

The line lengths L1(E, F) and L2(E, F) are measured by using the FEM substrate, and the coefficients in equations (4) and (5) are determined in advance. Line lengths L1m and L2m of the registration mark of the evaluation target substrate are measured and substituted into L1 and L2 of equations (6) and (7), respectively, thereby obtaining a focus value Fm and an exposure light amount Em. A deviation ΔF from the optimum focus value Fo and a deviation ΔE from the optimum exposure light amount Eo are given by:

$$\Delta F = Fm - Fo \quad (8)$$

$$\Delta E = Em - Eo. \quad (9)$$

Based on the resultant deviations ΔF and ΔE, a focus offset and an exposure light amount offset are given to the projection exposure apparatus 10 to correct the deviations. This allows correction and control to transfer and to expose a pattern on a reticle to a substrate under optimum exposure conditions (Eo, Fo). The method of feeding back or feeding forward to the projection exposure apparatus 10 is not limited to that described above. For example, predetermined threshold values may be set for the exposure light amount and the defocus value, based on the optimum exposure conditions. Offsets are given to the projection exposure apparatus 10 only when the exposure light amount and the defocus value exceed the threshold values. Alternatively, the developing apparatus and its PEB temperature and time may be used as the feedback or feedforward target apparatus and the apparatus variables. The etching parameters of an etching apparatus to be used after resist development may also be used.

The relational expressions between the line lengths L1 and L2, the exposure light amount E, and the focus value F are not limited to those described above. In the example described in this embodiment, the X-direction edge interval (line length) of a mark with rectangular patterns being arrayed in the Y direction, as shown in FIG. 4, is measured by an alignment scope for X-direction detection. Instead, the Y-direction edge interval (line length) of a mark formed by rotating the mark in FIG. 4 by 90°, while arraying the patterns in the X direction, may be measured by an alignment scope for Y-direction detection. To calculate the focus value and the exposure light amount, the average value of the measurement value in the X direction and that in the Y direction are preferably used. Alternatively, the focus value and the exposure light amount are preferably calculated by using a registration mark corresponding to the array direction of one of exposure target device patterns, which has the most strict exposure/transfer accuracy.

Second Embodiment

Figure 14B:
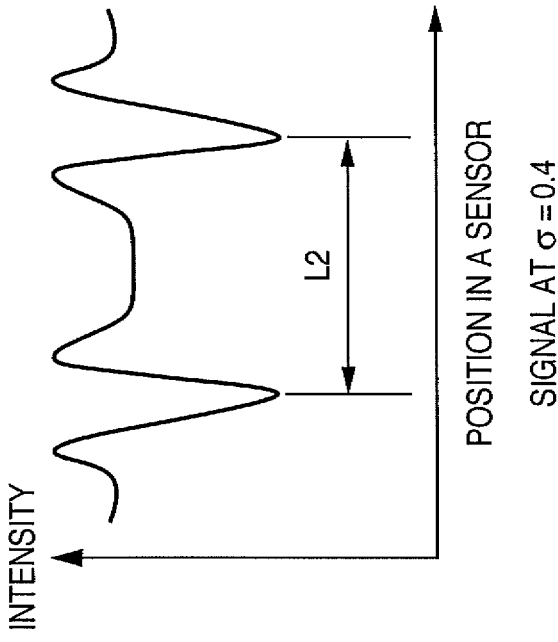
FIGS. 14A and 14B are graphs for explaining signal waveforms according to the second preferred embodiment of the present invention.
Figure 14A:
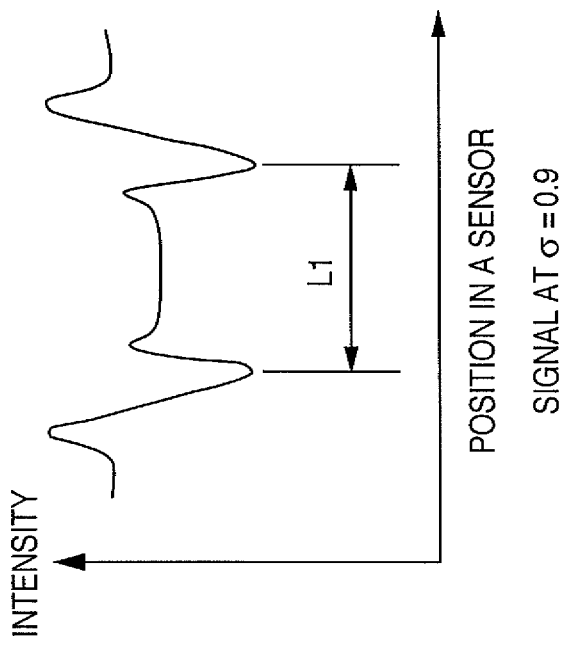

The second preferred embodiment of the present invention will be described next. As described above, in the characteristic representing the change in the line length measurement value of a registration mark with respect to focus, when the registration mark is measured under different measurement conditions, the focus position representing the extreme value (maximum value) of the line length changes. In the first embodiment, the illumination wavelength of the measuring apparatus is changed to achieve this. In the second embodiment, however, not the illumination wavelength, but the coherence of illumination is changed. The registration mark is the same as that in the first embodiment, and a description thereof will not be repeated. As the measuring apparatus, an alignment scope on a projection exposure apparatus 10 is used. A coherence o can be changed by changing the diameter of an aperture stop 20 in FIG. 2. In this embodiment, line length measurement values L1 and L2 corresponding to a line length L are obtained by measuring one registration mark at σ=0.9, as shown in FIG. 14A, and at σ=0.4, as shown in FIG. 14B. It is possible to shift the maximum position corresponding to the defocus value, as shown in FIG. 7, by changing the coherence a of the illumination system. That is, in this embodiment, condition 1 in FIG. 7 corresponds to measurement data at σ=0.9, and condition 2 corresponds to measurement data at σ=0.4.

The method of calculating and correcting the focus value and exposure light amount using the measurement data L1 and L2 is the same as that in the first embodiment, and a description thereof will not be repeated.

Third Embodiment

Figure 15:
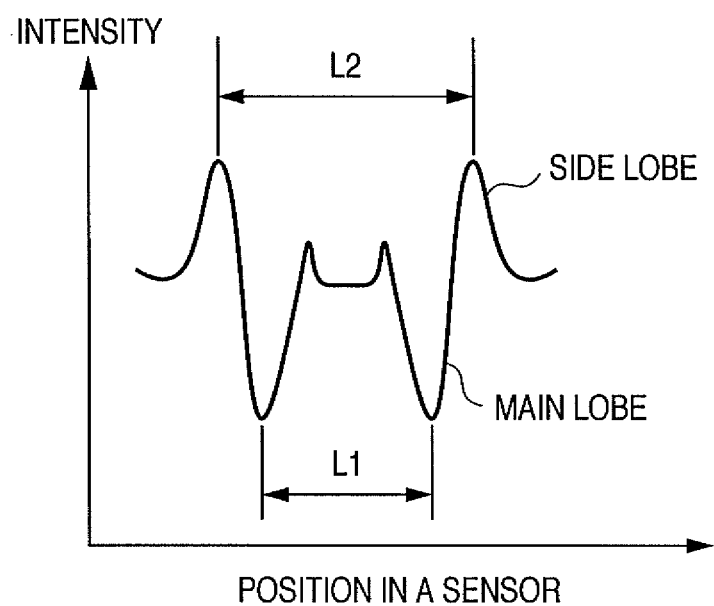
FIG. 15 is a graph for explaining a signal waveform according to the third preferred embodiment of the present invention.

The third preferred embodiment of the present invention will be described next. In this embodiment, two line length measurement values L1 and L2, depending on edges, are calculated by using a plurality of feature amounts of signal waveforms acquired from one registration mark, to change the focus position representing the extreme value (maximum value) of the line length. FIG. 15 is a graph for explaining a signal waveform, waveform feature amounts, and line length measurement positions, according to this embodiment. A registration mark is measured by the alignment detection system shown in FIG. 2, while fixing the illumination wavelength and the coherence of the illumination system. The interval between the main lobes of the signal waveform generated by the edges of the registration mark is measured as L1, and the interval of the side lobes is measured as L2. In this case, condition 1 corresponds to the interval between the main lobes, and condition 2 corresponds to the interval between the side lobes. The focus position representing the maximum value shifts so that it is possible to obtain the same effect as that in the above-described embodiments. In this embodiment, both the contrast of the side lobes and that of the main lobes are necessary. For this reason, it is preferable to set an aperture stop 20 in FIG. 2 to reduce a (e.g., σ=0.4 or less).

Fourth Embodiment

Figure 17A:
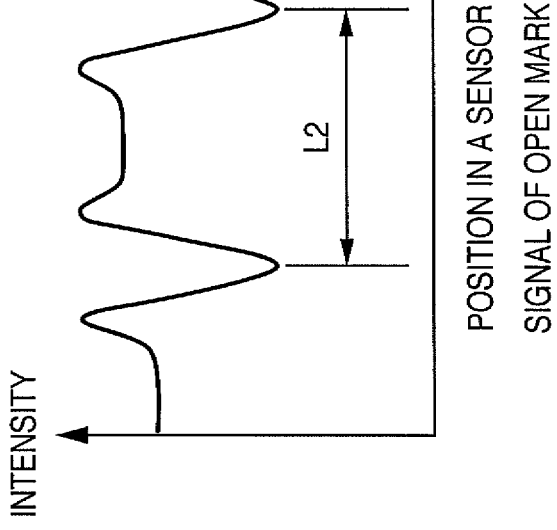
FIGS. 17A and 17B are graphs for explaining signal waveforms according to the fourth preferred embodiment of the present invention.
Figure 17B:
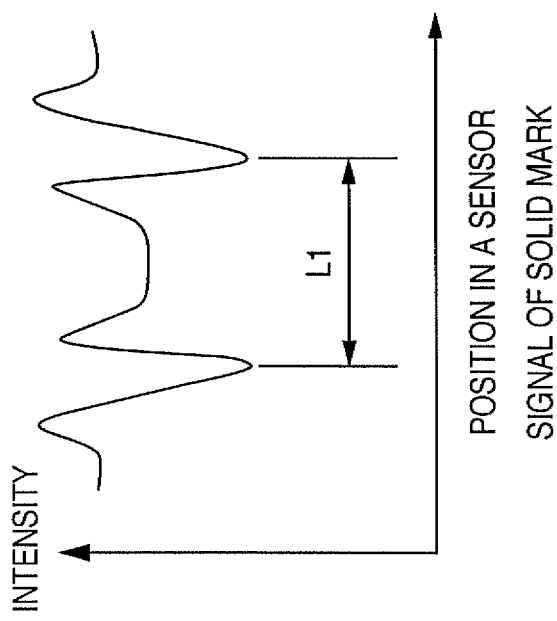
Figure 18A:
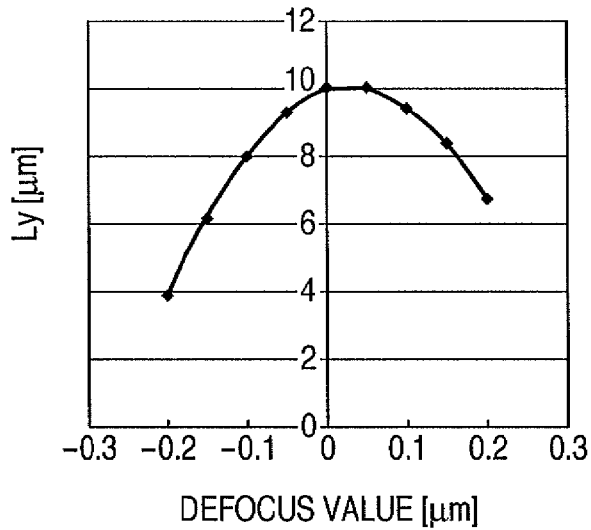
FIGS. 18A to 18C are graphs for explaining a problem of a prior art arrangement.
Figure 18B:
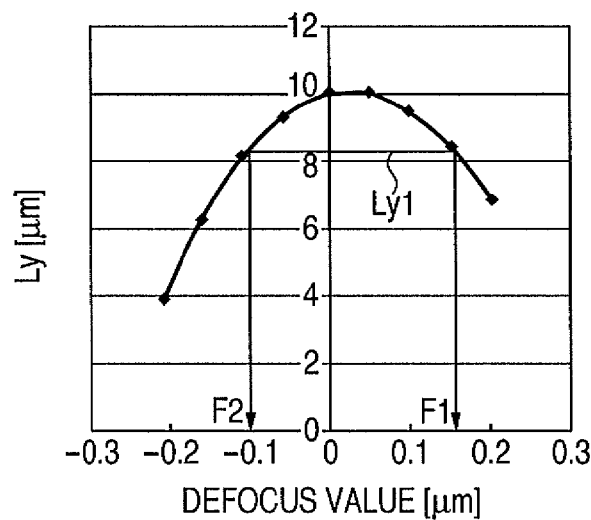
Figure 18C:
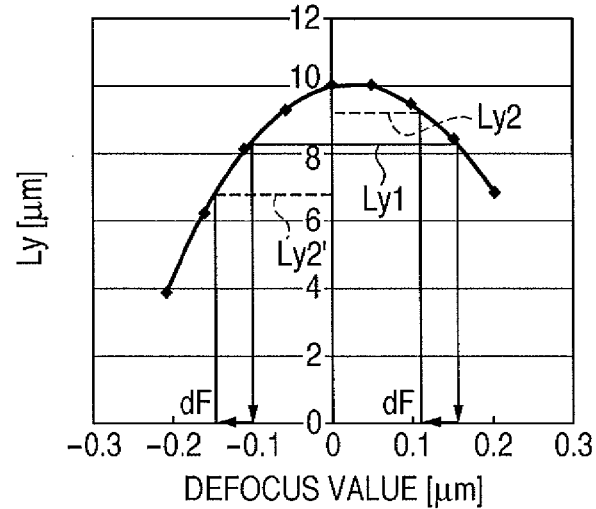
Figure 19:
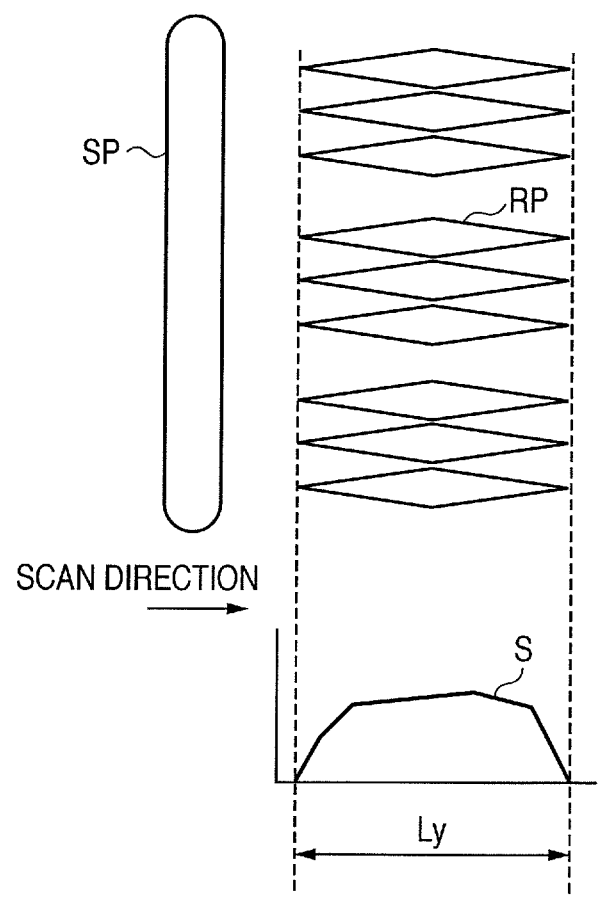
FIG. 19 is a view for explaining a conventional focus measuring method.

The fourth preferred embodiment of the present invention will be described next. In this embodiment, a registration mark formed from elements with two characteristics is used to change the focus position representing the extreme value (maximum value) of the line length. The registration mark used in this embodiment includes a solid mark 55P and an open mark 55N, as shown in FIG. 16, unlike the registration mark shown in FIG. 4, which is used in the first to third embodiments. The solid mark 55P is formed by arraying rectangular resist patterns on the substrate. The open mark 55N is formed by arraying open rectangular patterns (without a resist) in the resist pattern. FIGS. 17A and 17B are graphs for explaining signal waveforms, waveform feature amounts, and line length measurement positions, according to this embodiment. A registration mark is measured by the alignment detection system shown in FIG. 2, while fixing the illumination wavelength and the coherence of the illumination system. L1 is measured based on a signal waveform generated by the edges of the solid mark 55P of the registration mark 55. L2 is measured based on a signal waveform generated by the edges of the open mark 55N of the registration mark. In this case, condition 1 corresponds to the line length L1 of the solid mark, and condition 2 corresponds to the line length L2 of the open mark. The focus position representing the maximum value shifts so that it is possible to obtain the same effect as that in the above-described embodiments.

The present invention has been described above with reference to the first to fourth embodiments. The four embodiments may be combined. In the above-described examples, the two pieces of mark length information L1 and L2 are obtained under two different measurement conditions. At least two measurement conditions are necessary, and the number of measurement conditions may be increased further.

The measurement conditions are not limited to those of the above-described methods. Any other conditions that satisfy the characteristic feature of the present invention, i.e., changing the focus position representing the extreme value (maximum value) of the line length are usable, and different polarized light components are bright and dark fields may be used.

As the measuring apparatus, the alignment detection system on the projection exposure apparatus is used. Instead, a dedicated measuring apparatus may be used. An overlay inspection apparatus, which is used in a semiconductor manufacturing line as a standard inspection apparatus for evaluating the overlay accuracy, is also usable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A measuring apparatus that measures a substrate on which a line mark is formed with a resist via lithography, said apparatus comprising:
   an acquisition unit configured to acquire a corresponding line length of the line mark as an edge interval in an image of the line mark under each of two different measurement conditions; and
   a calculation unit configured to calculate a defocus value with which the lithography has formed the line mark based on a difference between the corresponding line lengths acquired by the acquisition unit under the two different measurement conditions.

2. The apparatus according to claim 1, wherein said calculation unit is configured to calculate the defocus value based on the difference and a predetermined relationship between the difference and the defocus value.

3. The apparatus according to claim 1, wherein said calculation unit is configured to further calculate a deviation of an exposure light amount with which the lithography has formed the line mark, based on the calculated defocus value and a predetermined relationship between the defocus value and the deviation.

4. The apparatus according to claim 1, wherein the measurement conditions are illumination conditions for illuminating the line mark to acquire the image.

5. The apparatus according to claim 4, wherein the illumination conditions concern a wavelength of light that illuminates the line mark.

6. The apparatus according to claim 4, wherein the illumination conditions concern a coherence of illumination of the line mark.

7. The apparatus according to claim 1, wherein the measurement conditions are kinds of lobes in a signal of the image for which the edge interval is acquired.

8. The apparatus according to claim 1, wherein the line mark includes a solid line mark and an open line mark, and the measurement conditions concern which of the solid line mark and the open line mark is subjected to acquisition of the line length by the acquisition unit.

9. A projection exposure apparatus comprising:
   an optical system configured to expose a substrate to exposure light via an original having a pattern; and
   a measuring apparatus defined in claim 1.

10. A measurement apparatus that measures a defocus value of an exposure apparatus that includes a projection optical system configured to project an image of a pattern of an original onto a substrate, said measurement apparatus comprising:
    a measurement unit including a sensor and configured to sense, by said sensor, an image of a registration mark formed on the substrate by the exposure apparatus and to measure an edge interval in the image of the registration mark sensed by said sensor, wherein the measurement unit is configured to measure, under each of two different measurement conditions, an edge interval in a first image of the registration mark formed on the substrate by the exposure apparatus with each of a plurality of defocus values of the exposure apparatus, and to measure, under the two different measurement conditions, an edge interval in a second image of the registration mark formed on the substrate by the exposure apparatus with a certain defocus value;
    an acquisition unit configured to acquire a relationship between the defocus value of the exposure apparatus and the edge interval in the image of the registration mark, wherein the acquisition unit is configured to acquire a first relationship between the defocus value of the exposure apparatus and the edge interval in the first image with respect to each of the two different measurement conditions, the two different measurement conditions being two measurement conditions that the edge intervals in the first image have respective external values at different defocus values of the exposure apparatus in the first relationship, and
    a processor configured to obtain the defocus value of the exposure apparatus, wherein the processor is configured to obtain, based on a second relationship between each of the plurality of the defocus values and a difference, corresponding thereto, between the edge intervals in the first image under the two different measurement conditions, and a difference between the edge intervals in the second image under the two different measurement conditions, a defocus value with which the exposure apparatus formed the registration mark, corresponding to the second image, on the substrate.

* * * * *